(12) United States Patent
Torres

(10) Patent No.: US 7,180,221 B1
(45) Date of Patent: Feb. 20, 2007

(54) PIEZO-ELECTRIC ASSEMBLY

(76) Inventor: Felix Torres, 6501 SW. 111 St., Miami, FL (US) 33156

( * ) Notice: Subject to any disclaimer, the term of this patent is extended or adjusted under 35 U.S.C. 154(b) by 0 days.

(21) Appl. No.: 11/229,738

(22) Filed: Sep. 17, 2005

(51) Int. Cl.
H01L 41/09 (2006.01)
H02N 2/04 (2006.01)
H02N 2/12 (2006.01)

(52) U.S. Cl. .......... 310/311; 310/328; 310/329

(58) Field of Classification Search ........ 310/311, 310/328, 323.01, 323.08, 323.09, 323.12, 310/323.13, 323.14, 323.16, 323.17, 323.18, 310/329
See application file for complete search history.

(56) References Cited

U.S. PATENT DOCUMENTS

| | | | |
|---|---|---|---|
| 4,019,073 A | 4/1977 | Vishnevsky et al. | |
| 4,168,577 A | 9/1979 | Soderkvist et al. | |
| 4,318,459 A | 3/1982 | Armour | |
| 4,613,782 A | 9/1986 | Mori et al. | |
| 4,620,122 A | 10/1986 | Howell | |
| 4,736,131 A | 4/1988 | Fujimoto | |
| 4,894,579 A | 1/1990 | Higuchi et al. | |
| 4,928,030 A | 5/1990 | Culp | |
| 5,034,647 A | 7/1991 | Ohtsuka | |
| 5,039,899 A | 8/1991 | Yamaguchi | |
| 5,225,941 A | 7/1993 | Saito et al. | |
| 5,394,049 A | 2/1995 | Luecke | |
| 5,424,597 A | 6/1995 | Gloss et al. | |
| 5,465,021 A | 11/1995 | Visscher et al. | |
| 5,563,465 A | 10/1996 | Nakahara et al. | |
| 5,656,769 A * | 8/1997 | Nakano et al. | 73/105 |
| 5,726,520 A * | 3/1998 | Grahn | 310/328 |
| 6,018,991 A * | 2/2000 | Nakano | 73/105 |
| 6,111,336 A | 8/2000 | Yoshida et al. | |
| 6,476,537 B1 | 11/2002 | Pease et al. | |
| 6,508,592 B1 * | 1/2003 | Perni et al. | 384/517 |
| 6,771,004 B1 * | 8/2004 | Matsuda et al. | 310/328 |

* cited by examiner

Primary Examiner—Darren Schuberg
Assistant Examiner—Derek Rosenau

(57) ABSTRACT

A piezo-electric type of assembly for effecting and interfacing relative motion between two surfaces. The assembly consisting of a first and a second transducer to be driven by electrical signals. Both transducers are coupled at one end to a low inertia member that is to make contact with a second surface. The first transducer controls this contact by moving the low inertial member relative to a high inertia member. The second transducer is coupled at the other end to a first surface. While the low inertia member is making contact with the second surface, activation of the second transducer causes relative motion between the first surface and the second surface due to frictional contact. The second transducer is reset while the first transducer causes momentary break of contact. The operation of this cycle has many applications.

20 Claims, 10 Drawing Sheets

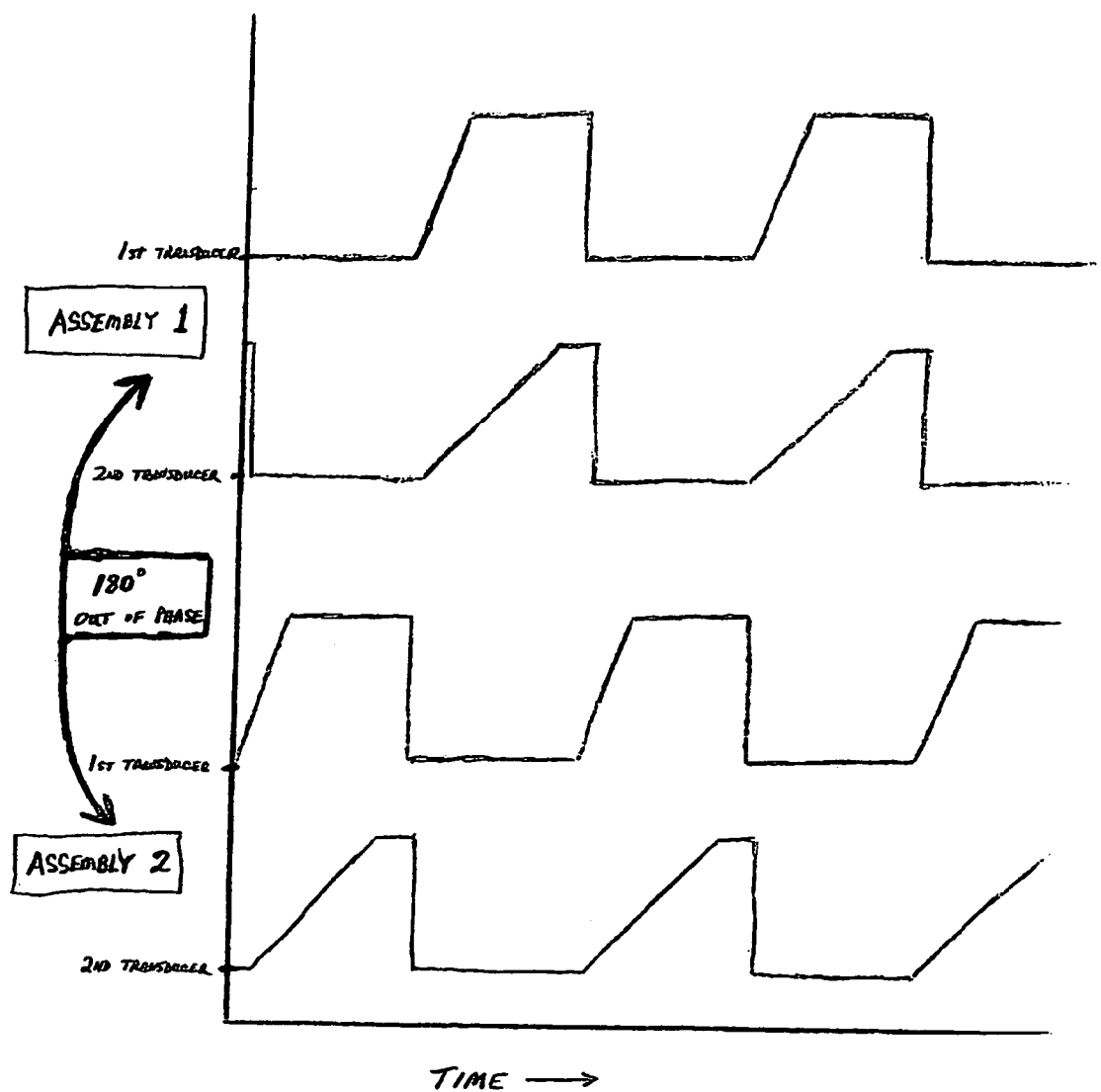

PIEZO-ELECTRIC ASSEMBLY

FEDERALLY SPONSORED RESEARCH

Not Applicable

SEQUENCE LISTING OR PROGRAM

Not Applicable

BACKGROUND—FIELD OF INVENTION

This invention relates to a piezo-electric type of assembly, specifically an assembly for effecting and interfacing relative motion between surfaces.

BACKGROUND—DESCRIPTION OF PRIOR ART

Many assemblies have been proposed over the years utilizing piezo-electric transducers for driving or interfacing another object. Most take advantage of the piezo-electric devices in that they can exert strong forces, operate very fast, and move in very small steps. Likewise, they try to compensate for the limiting factors that piezo-electric elements have, such as: very small movement amount, variations in movement amount, and not being able to handle certain types of forces. This results in designs that are very application specific and therefore more costly. Much effort is put into a sophisticated mechanical design to compensate for the disadvantages of the piezo-electric elements.

Some of the older patents such as U.S. Pat. No. 4,928,030 by Culp, proposed assemblies with simpler design but with disadvantages. For instance, the movement in one direction of a piezo-electric element whose part thereof is in frictional contact with the object to be moved and then the quick reset. This design does not allow for good frictional contact in the forward direction and does not allow for free movement in the resetting stroke.

Other patents such as U.S. Pat. No. 4,613,782 by Mori & Ogiso, propose assemblies that produce a circular or elliptical movement of a contacting portion. This design does not account for variations in the amount of movement that a piezo-electric element produces. Also, it does not allow for much flexibility between the movement that is made to make contact with the object and that which is made to move the object.

In a newer patent such as U.S. Pat. No. 5,424,597 by Gloss & Marth specific control links are used to control the contacting action of the assembly. This design allows for variations in the amount of motion that piezo-electrics have. However, the control links are inefficient, complicated, and have to be built very precisely. A very coordinated mechanical movement has to take place and the object to be moved has to be specific.

In all the designs mentioned above there is no allowance for things such as: a small shift or movement of the assembly, a variation or shift of the object being moved, or even a small speck of dust or other foreign object getting into the assembly. Again, the designs are very rigid and application specific. There is not much flexibility as to the use of the assembly or its functionality.

OBJECTS AND ADVANTAGES

It is an objective of the present invention to provide a piezo-electric type of assembly that makes the most use of the advantages that piezo-electrics have. Besides the advantages already mentioned, piezo-electrics are known to operate with very little energy loss. They can operate for extended periods of time without wear and tear. A motion assembly consisting of piezo-electrics should also be able to operate for extended periods of time without wear and tear and with small energy losses. Also, piezo-electrics can operate very fast. In motion assemblies piezo-electrics should interact with other piezo-electrics and with low inertia members to make the most use of this.

It is also an objective of the present invention to provide a piezo-electric assembly that minimizes the effects of the disadvantages of piezo-electrics. For instance, the amount of extension that a piezo-electric transducer undergoes under a certain applied voltage varies depending on environmental conditions. Changes in the environment should have very little effect on the operation of this piezo-electric assembly. Also, piezo-electrics cannot handle and will fail under certain types of forces. The assembly is to be built and operated in such a manner as to not allow these forces to exceed a certain amount.

Besides those mentioned above, some of the advantages of the piezo-electric assembly described in this invention are:

Variations in the specifics of the objects to be moved or interfaced do not matter as much. Variations in the object or the assembly due to environmental changes do not have as much of an effect. This results in more flexibility as to its applications.

Minimal mechanical parts are needed. This makes it less prone to failure, energy loss, or loss of speed. It also takes up less space. Operation inadequacies are corrected via the electrical signals that are applied to the piezo-electric transducers, as opposed to using mechanical means.

The motion of each piezo-electric transducer in the assembly is for one purpose and not for a dual purpose. It does not have to be exactly coordinated with another piezo-electric transducer or mechanism. Each piezo-electric transducer can be used to its full extent for one thing. This allows, for instance, for more motion in each direction.

There is individual control of each piezo-electric transducer and, again, it does not have to be coordinated such that it is limited by anything else. This allows for many more types of motion for the assembly as a whole and therefore more flexibility.

The assembly will hold moveable objects in place when it is not being operated.

With the use of sensor feedback from the individual piezo-electric transducers, the electrical signals applied can be varied individually to give optimum operation of the assembly for a specific application.

DESCRIPTION OF THE DRAWINGS

FIG. 10 shows typical waveforms of electrical signals that would be applied to the assemblies of the applications described in FIGS. 9A and 9B in order to maintain contact at all times.

DETAILED DESCRIPTION

Preferred Embodiment

Preferred embodiments of the present invention will be described hereunder with reference to the accompanying drawings.

Figure 1:
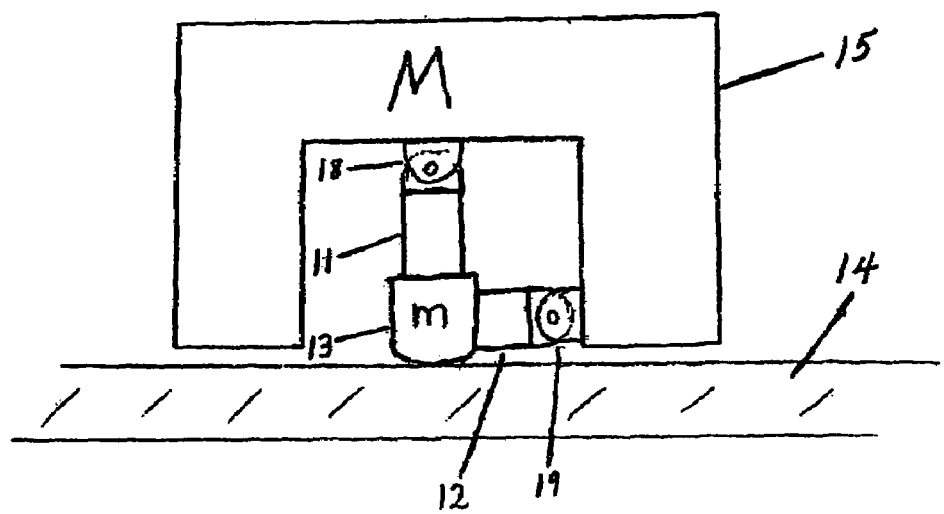
FIG. 1 details the main components of the piezo-electric assembly of the preferred embodiment of this invention.

FIG. 1 illustrates the main components of the piezo-electric assembly of this preferred embodiment. A first piezo-electric transducer 11 connects together a low inertia member 13 and a high inertia member 15. Connection takes place via direct attachment at the low inertia member end. Connection takes place via a flexible joint 18 at the high inertia member end. In this preferred embodiment the flexible joint 18 is a hinge.

A second piezo-electric transducer 12 connects together the same low inertia member 13 and the same high inertial member 15, but in a different position. Again, connection takes place via direct attachment at the low inertia member end and via a hinge 19 at the high inertia member end.

The low inertia member 13 is the contact making member. A surface 14 exists onto which a portion of the low inertia member makes contact.

Upon application or removal of an electrical signal to the piezo-electric transducer a force is applied to the inertia members attached to it. Based on the formula F=ma and assuming this is the only force acting on the inertia members, ma=MA results. Here "m" and "a" are the mass and acceleration of the low inertia member and "M" and "A" are the mass and acceleration of the high inertia member. Thus, the low inertia member will have a much higher acceleration than the high inertia member. With inertia members attached to the ends of the piezo-electric transducer, upon activation of which results in motion of the inertia members either towards or away from each other, the low inertia member will mostly move.

The piezo-electric transducers are attached to the inertia members such that activation of the first piezo-electric transducer 11 results in a motion of the low inertia member 13 in a first direction that is approximately perpendicular or normal to the surface 14. Activation of the second piezo-electric transducer 12 results mostly in motion of the low inertia member 13 in a second direction that is approximately parallel to the surface 14. The hinge 18 is rigid in the first direction of motion, i.e. when the first piezo-electric transducer is activated, but is flexible to allow motion in the second direction, i.e. when the second piezo-electric transducer is activated. Likewise, the hinge 19 is rigid in the second direction of motion, but is flexible to allow motion in the first direction.

Figure 2:
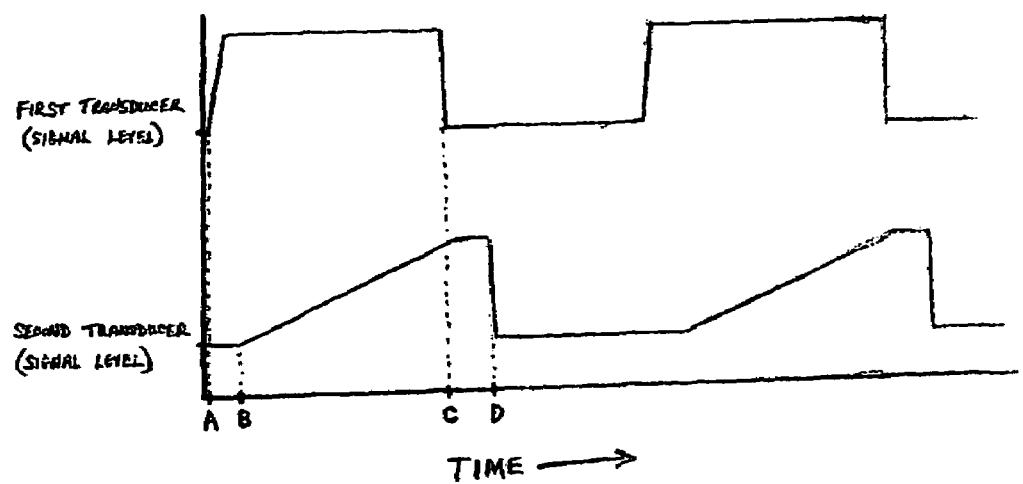
FIG. 2 shows typical waveforms of electrical signals that would be applied to the piezo-electric transducers of a preferred embodiment assembly.

Each piezo-electric transducer is activated by electrical signals applied to it via an electrical connection. FIG. 2 shows typical signals that would be applied to the piezo-electric transducers in this embodiment. With reference to FIG. 1, assume the high inertia member 15 is free to move in directions parallel and perpendicular to the surface 14, and the surface 14 is fixed in place. With gravity acting on the high inertia member 15, the assembly is resting on surface 14 via low inertia member 13 making contact with surface 14. At point A, in FIG. 2, a signal is applied to the first piezo-electric transducer 11 first, which causes it to expand and stay expanded, but has no other effect other than to move the high inertia member 15 slightly up. Then, at point B in FIG. 2, a signal is slowly applied to the second piezo-electric transducer 12, which causes it to expand. Due to the low inertia member 13 being in frictional contact with surface 14, the high inertia member 15 is moved to the right slightly. Suddenly, at point C, in FIG. 2, the electrical signal to the first piezo-electric transducer 11 is removed. This allows the low inertia member 13 to momentarily move off the surface 14. It is during this short time that the signal is removed (point D, FIG. 2) from the second piezo-electric transducer 12, allowing it to reset and at the same time move the low inertia member 13 to the right while it is not in frictional contact with the surface 14. Overall now the whole assembly has moved slightly to the right, and the whole cycle starts all over again. Repetition of this cycle will cause the assembly to continue to move to the right at a steady rate.

Now, again with reference to FIG. 1, assume that the high inertia member 15 is held from moving in a direction parallel to the surface 14, but allowed to move in a direction normal to this surface 14, and the surface is free to move to the left or right. Also assume, as before, that gravity is acting on the high inertia member 15 and that the assembly is resting on surface 14 via low inertia member 13 making contact with surface 14. A signal is applied to first piezo-electric transducer 11 (point A, FIG. 2), which causes it to expand and stay expanded. Then a signal is slowly applied to the second piezo-electric transducer 12 (point B, FIG. 2) which expands it. Since the low inertia member 13 is in frictional contact with surface 14, and since now the high inertia member 15 is being held from movement parallel to the surface 14, the surface 14 itself will now move slightly to the left. Suddenly, (point C, FIG. 2) the electrical signal is removed from the first piezo-electric transducer 11, which causes the low inertia member 13 to momentarily move off the surface 14. During this short time the signal is removed (point D, FIG. 2) from the second piezo-electric transducer 12, allowing it to move the low inertia member 13 back to the right while it is not in frictional contact with the surface 14. Overall, now the surface 14 has been moved slightly to the left, and the whole cycle starts all over again. Repetition of this cycle will cause the surface 14 to continue to move to the left at a steady rate.

Figure 3A:
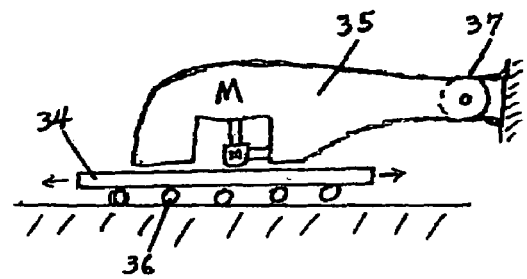
FIGS. 3A, 3B, 3C, 3D, and 3E show illustrations of the assembly of this preferred embodiment in various applications.
Figure 3B:
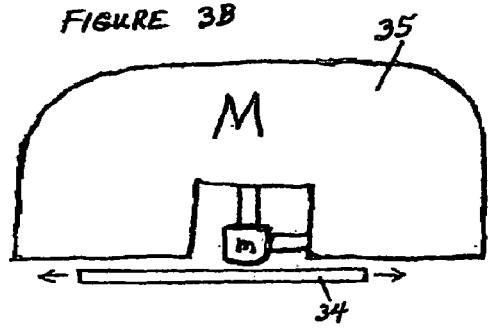
Figure 3C:
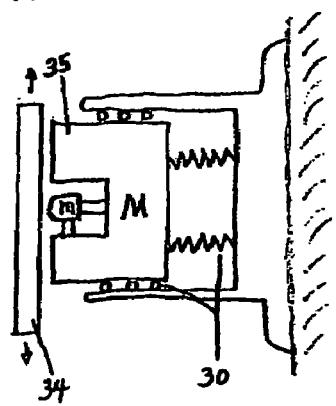
Figure 3D:
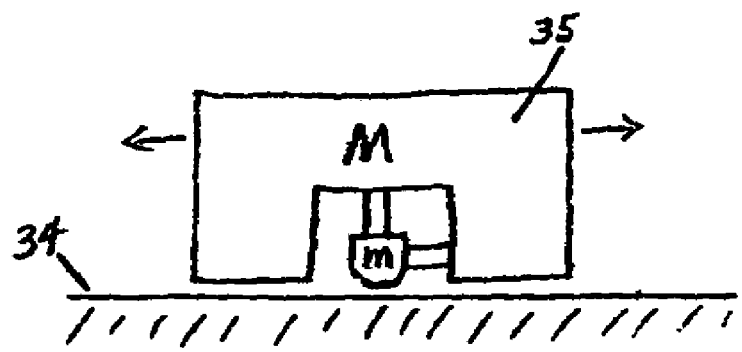
Figure 3E:
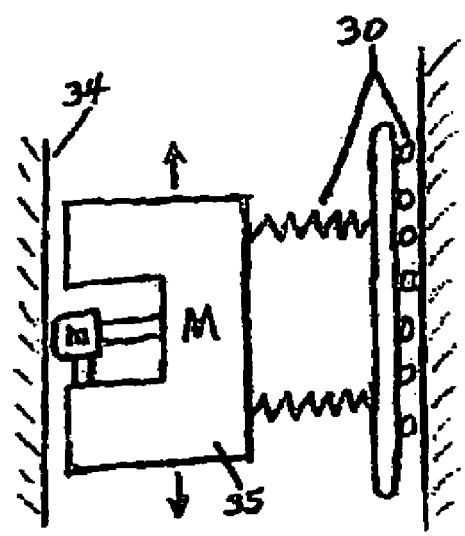

FIGS. 3A, 3B, 3C, 3D, and 3E offer other illustrations of the preferred embodiment of the piezo-electric assembly. In all these illustrations the setup and operation of the assembly itself is the same as described previously, i.e. FIG. 1. In FIG. 3A the high inertia member 35 is held from moving in a direction parallel to the surface by a hinge 37, but is acted upon by gravity and can move in a direction perpendicular or normal to the surface. A moveable surface 34 sits on roller bearings 36 to allow for support and movement. FIG. 3B shows a special case where the surface 34 to be moved is of low inertia compared to the high inertia member 35. As before, gravity acts on the high inertia member 35 to move it towards the surface. In this case, however, the large inertia of the high inertia member 35 compared to the inertia of the surface 34 keeps the high inertia member from moving to the right or left relative to the surface 34. FIG. 3C shows a case where the setup is oriented such that gravity does not act on the high inertia member 35 to move it towards the surface. Therefore, a fixed spring and roller bearing assembly 30 is used. The springs push the high inertia member 35 towards the surface and the roller bearings keep the high inertia member 35 from moving parallel to the surface 34 but at the same time allow for movement normal or perpendicular to the surface 34. Now FIGS. 3D and 3E illustrate a case where the surface 34 is fixed or of very high inertia compared to the assembly and therefore is relatively motionless. Here, by operating the assembly the same way, the assembly itself moves parallel to the surface 34. In FIG. 3D the high inertia member 35 is being pushed towards the surface by gravity and is free to move parallel to it. In FIG. 3E the high inertia member 35 is being pushed towards the surface via a spring and roller bearing assembly 30. The springs push the high inertia member 35 while the roller bearings allow the assembly to move parallel to the surface 34.

Alternative Embodiments

Figure 4:
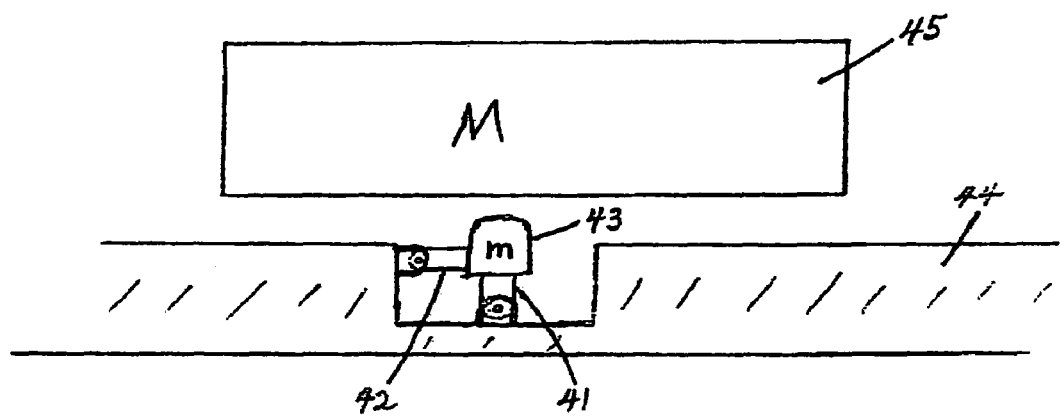
FIG. 4 details the main components of an alternative embodiment of the piezo-electric assembly.

FIG. 4 shows the main components of an alternative embodiment of the piezo-electric assembly. Like in the preferred embodiment, there exists a surface 44, a high inertia member 45, and a low inertia member 43. A first piezo-electric transducer 41, and a second piezo electric transducer 42 are attached to the low inertia member 43 in the same way. The difference however is that the piezo electric transducers are not attached to the high inertia member 45. They are now attached to the surface 44, and again in such a way as to allow for movement of the low inertia member 43 in directions approximately parallel and perpendicular to this surface 44. The high inertia member 45 now sits as though it is going to make contact with the surface 44. The contacting portion of the low inertia member has to be at least slightly higher than the surface 44 so as to make contact with the high inertia member 45 before the high inertia member makes contact with the surface 44.

Referencing FIG. 4 and assuming the surface is fixed with reference to the high inertia member, electrical signals of the type described in the preferred embodiment (i.e. FIG. 2) are applied to the piezo-electric transducers. Again, at the start the high inertia member 45 sits there with gravity acting down on it, making contact with the contact making portion of the low inertia member 43. A signal is applied to the first piezo-electric transducer 41 (point A, FIG. 2) that extends it and the low inertia member 43 continues to make contact with the high inertia member 45. A signal is now applied to the second piezo-electric transducer 42 (point B, FIG. 2) that causes the low inertia member 43 to move parallel to the surface 44. Due to frictional contact with the high inertia member 45, the high inertia member 45 is moved in the direction of movement of the low inertia member 43. At the end of this movement the electrical signal to the first piezo-electric transducer 41 (point C, FIG. 2) is suddenly removed and again due to the difference in inertia the low inertia member 43 suddenly moves away from contact with the high inertia member 45. During this time the signal to the second piezo-electric transducer 42 (point D, FIG. 2) is removed allowing the low inertia member 43 to return back to its first position without making contact with the high inertia member 45. Overall now the high inertia member 45 has moved slightly in a direction parallel to the surface. At this point, the cycle starts all over again. Continuation of this cycle provides continuous movement of the high inertia member 45 over the surface 44, all motion being specified by the signals sent to the piezo-electric transducers.

Figure 5A:
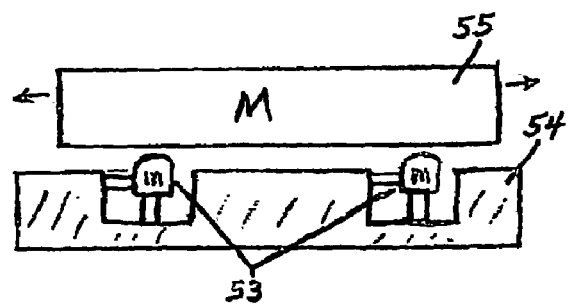
FIGS. 5A, 5B, and 5C show illustrations of an alternative embodiment of the piezo-electric assembly in different applications.
Figure 5B:
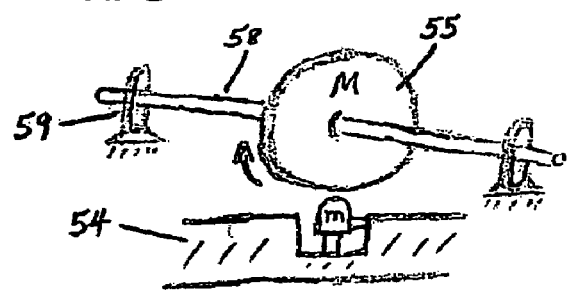
Figure 5C:
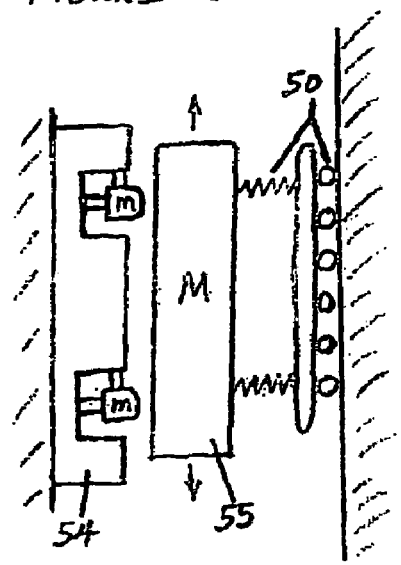

FIGS. 5A, 5B, and 5C offer different illustrations of this embodiment. In all of these the setup and operation of the assembly is as described above. FIG. 5A illustrates a case where the surface 54 is not necessarily fixed but instead has a high inertia compared to the high inertia member 55. Also the surface 54 contains multiple low inertia members 53, each with corresponding first and second piezo-electric transducers. Upon operation of the assemblies a high inertia member 55 could continue to move over the surface 54 and be supported by the low inertia members 53. FIG. 5B illustrates a case where the high inertia member 55 is a wheel that has an axis 58 with supports 59. The supports 59 allow for movement in a direction normal to a fixed surface 54 but do not allow for movement parallel to the surface 54. Again, gravity pushes down on the wheel. The wheel is however allowed to rotate along its axis 58. Upon operation of the assembly, the wheel rotates on its axis. FIG. 5C illustrates the case where the assembly is oriented such that gravity does not push the high inertia member 55 towards the surface 54. Here again a spring and roller bearing assembly 50 force the high inertia member 55 towards the surface 54 and at the same time allow for movement of the high inertia member 55 parallel to the surface 54.

Figure 6:
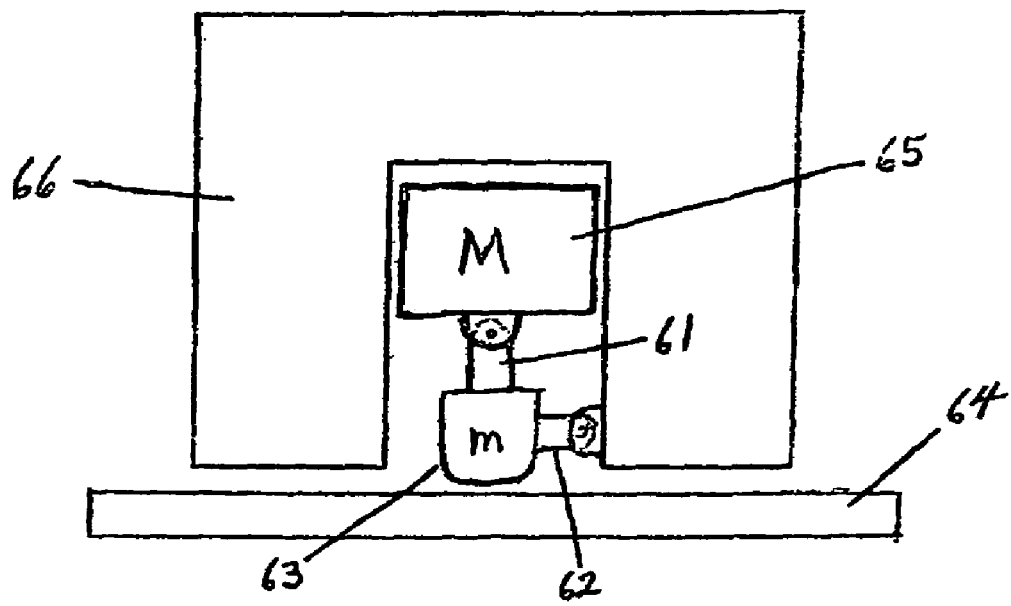
FIG. 6 details the main components of a second alternative embodiment of the piezo-electric assembly.

FIG. 6 shows the main components of another embodiment of the piezo-electric assembly. This embodiment is like a mix between the preferred embodiment and the first alternative embodiment. Again, there exists a surface 64 herein called the second surface, a high inertia member 65, and a low inertia member 63. A first piezo-electric transducer 61 and a second piezo-electric transducer 62 are attached to the low inertia member 63 in the same way. The difference here is that the other end of the second piezo-electric transducer 62 is attached to another surface 66, herein called the first surface. The other end of the first piezo-electric transducer 61 is attached to the high inertia member 65. They are again attached in such a way as to allow for movement of the low inertia member 63 in directions approximately parallel and perpendicular to the second surface 64. The high inertia member 65 is part of the first surface 66, and the first surface 66 has to allow for movement of the high inertia member 65 in a direction approximately perpendicular to the second surface 64. The first surface 66 also has to allow the low inertia member 63 to make contact with the second surface 64 before it does.

Figure 7A:
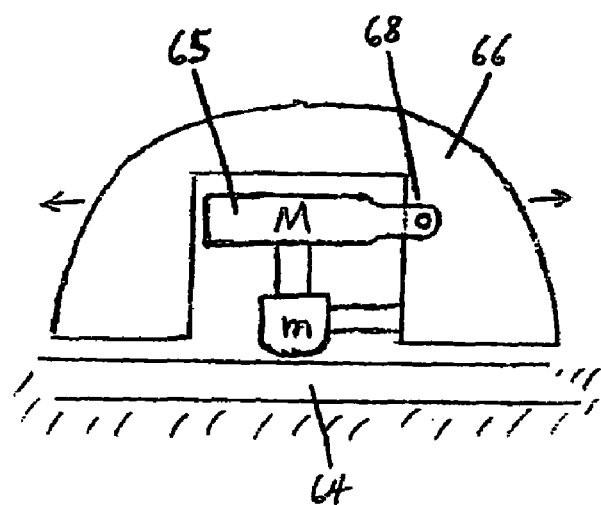
FIGS. 7A and 7B show illustrations of this second alternative embodiment piezo-electric assembly in different applications.
Figure 7B:
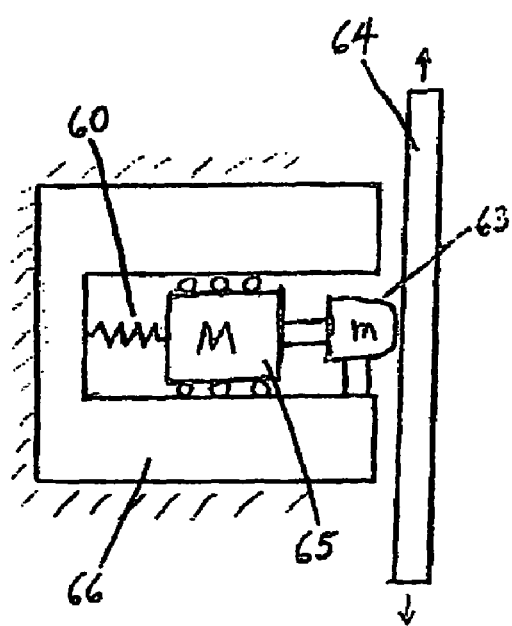

Applying signals of the type described in FIG. 2 to this embodiment gives results that are similar to the ones in the preferred embodiment. The difference being that now the second surface 64 moves with reference to the first surface 66 or vice versa. FIGS. 7A and 7B show different illustrations of this embodiment. In FIG. 7A, the second surface 64 is fixed. The high inertia member 65 is connected to the first surface 66 via hinge 68. This allows the high inertia member 65 to move in directions perpendicular to second surface 64. Upon operation of the piezo-electric transducers the first surface 66 could be moved with reference to the fixed second surface 64. In FIG. 7B the first surface 66 is fixed. The first surface 66 holds the high inertia member 65 but allows it to move perpendicular to second surface 64. A spring 60 acts on the high inertia member to insure low inertia member 63 makes contact with the second surface 64.

Upon operation of the piezo-electric transducers, the second surface 64 could be moved with reference to the first surface 66.

Figure 8:
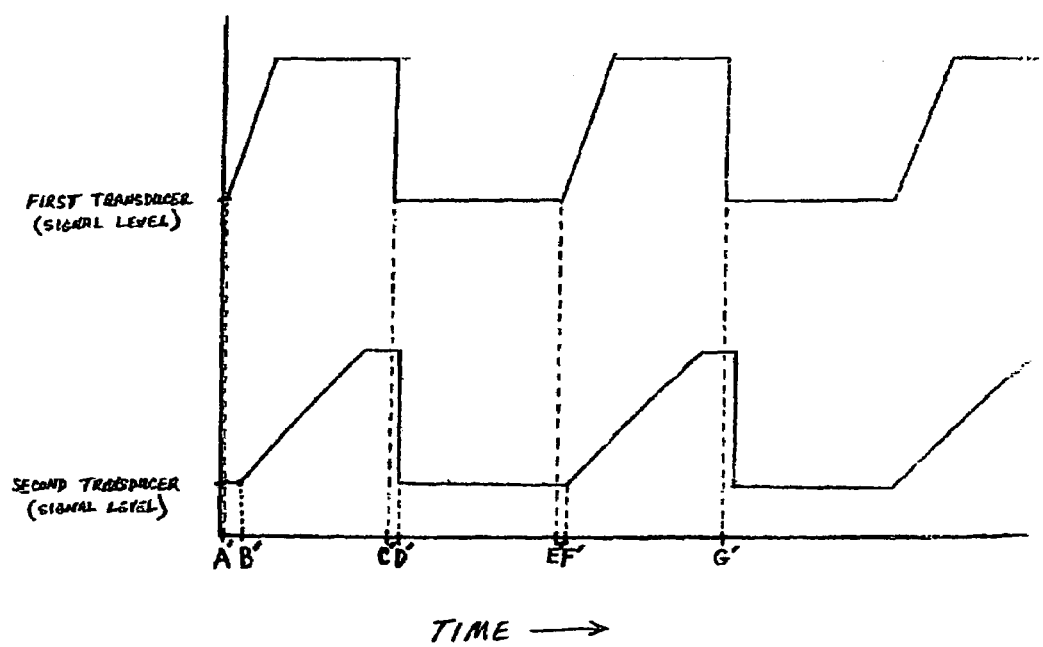
FIG. 8 shows typical waveforms of electrical signals that would be applied to the piezo-electric transducers in an alternative embodiment in which the assemblies are used to simulate frictionless motion.

The following are other embodiments of the piezo-electric assembly described in this invention. Referring to FIGS. 1, 4 and 6 these typical versions of the assembly can be made to operate differently by changing the timing of the applied electrical signals, and thus result in different embodiments. In FIG. 1, if the high inertia member 15 was being moved over the surface 14 by an external force or alternatively if the surface 14 was being moved with reference to the high inertia member 15, this could be done as if there was no friction between them. FIG. 8 shows the timing of the signals to be applied to the piezo-electric transducers in order to achieve this. At point A', a signal is applied to first piezo-electric transducer 11 just to extend it. Now if the surface 14 is pushed along and starts to move with reference to the high inertia member 15, or vice versa, at point B' in FIG. 8 a signal is applied to the second piezo-electric transducer 12 such that it makes the low inertia member 13 that is in frictional contact with surface 14 move with the surface. At the point of maximum extension of the second piezo-electric transducer 12, or at point C' is FIG. 8, the signal is suddenly removed from the first piezo-electric transducer 11 causing it to move the low inertia member 13 away from the surface 14. The surface continues to be moved along by an external force while there is no frictional contact between the low inertia member 13 and itself. At point D', in FIG. 8, the second piezo-electric transducer needs to be reset to be ready to start the cycle again. It has to be reset now, while there is not contact between the low inertia member 13 and the surface 14. At point E' in FIG. 8 the first piezo-electric transducer 11 needs to be extended again to restart the cycle. As soon as this is done the low inertia member 13 makes contact with the surface 14 again, so the signal to the second piezo-electric transducer 12 needs to be applied immediately (point F' in FIG. 8) so that as low inertia member 13 makes contact it is already moving with the same motion as the surface 14. Again at full extension of the second piezo-electric transducer 12 the low inertia member 13 is suddenly moved away from the surface 14 by the first piezo-electric transducer 11 (point G' in FIG. 8), and like this the cycle continues. Different adjustments have to be made to the timing of the signals dependent on whether the motion of the surface 14 is just starting and accelerating or depending on its velocity of motion.

With reference to FIG. 4, if, for instance, the high inertia member 45 were being moved by an external force over the surface 44, by applying the signals described in FIG. 8 to the piezo-electric transducers the high inertia member 45 could similarly move over the surface 44 as if there was no friction between it and the surface.

Another possibility is that, for instance, a high inertia member and a surface that are moving with reference to each other are apart and need to come in contact with each other without frictional wear at the contact point. If, as described at point E' of FIG. 8, the first piezo-electric transducer is extended just before the high inertia member and the surface make contact and right afterwards the second piezo-electric transducer (point F' in FIG. 8) is extended to cause motion of the contact making low inertia member with the proper speed and direction to account for the relative motion between the high inertia member and the surface, then the two can come together without frictional wear. Alternatively, if for instance, the high inertia member and the surface are moving together and will be coming apart such that they will have different motions (i.e. different inertia) when they come apart, this can be done such that there is no frictional wear as they come apart. If right before the items come apart, the action of the piezo-electric transducer is as described in point C' of FIG. 8 and if the items are taken apart right after this then they will come apart when there is no contact between low inertia member and surface and therefore there is no frictional wear.

Figure 9A:
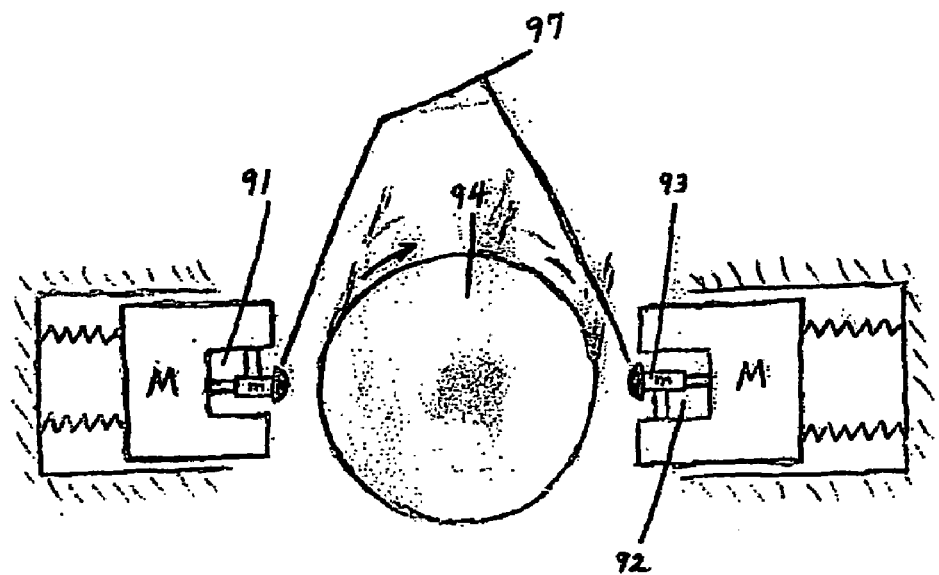
FIGS. 9A and 9B illustrate applications where the assemblies simulate frictionless motion while maintaining electrical or thermal contact by using multiple assemblies.
Figure 9B:
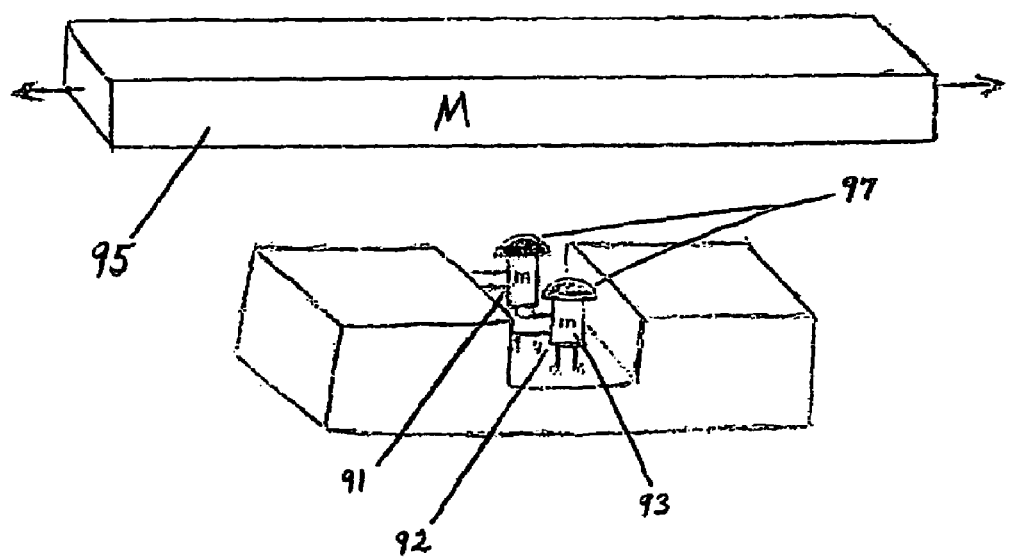

Other uses of this embodiment are illustrated in FIGS. 9A and 9B. Here there is a need to maintain good electrical or thermal contact between surfaces that are moving relative to one another. If two assemblies are used, each operated as described for frictionless movement, but they are operated at about 180° out of phase, then there can be frictionless movement while always having one of the assemblies making contact. FIG. 10 shows the timing of electrical signals being applied to the piezo-electric transducer in each of the assemblies in order to achieve this. In FIG. 9A, a rotating shaft 94 is the moving surface. The tips 97 of the low inertia member 93 in each assembly are electrically or thermally conductive as well as the rotating shaft. By applying signals as shown in FIG. 10 to the piezo-electric transducer, the first assembly 91 has the tip on its low inertia member make contact and moves with the shaft. Just before this low inertia member is to be lifted from the surface, the tip on the low inertia member of the second assembly 92 makes contact with the surface and again moves with the surface momentarily. Then just before this one is lifted, the first assembly 91 makes contact again. If this cycle is continued, contact is always maintained through either the first or second assembly and the contact of each is frictionless.

In FIG. 9B, again there is a first assembly 91 and second assembly 92 and their tips 97 are electrically or thermally conductive. Here the high inertia member 95 is also electrically or thermally conductive. By applying the timing signals shown in FIG. 10 to the assemblies the high inertia member can move over the surface as if frictionless but at least one of the tips 97 of the low inertia member 93 is always in contact with it and thus we maintain electrical or thermal contact.

CONCLUSION, RAMIFICATIONS, AND SCOPE

As per the above descriptions, it can be seen that the piezo-electric assembly of this invention can be used for effecting and interfacing motion of many types. It has advantages in that it is more universal and adaptable to different tasks, as opposed to more task specific assemblies that are more expensive. By simply varying the electrical signals applied, the assembly can be adapted to a different use. Its design is simple, durable and efficient, and its efficiency for the specific task at hand can be maximized by just varying the electrical signals applied. In addition to these advantages it still maintains the advantages claimed by other patents such as: environmental affects on piezo-electric transducers not affecting the overall operation of the assembly, good frictional contact being assured regardless of small variations on the surface to be contacted, and the object to be moved is held in place by the assembly even when the assembly is not operating.

Although the descriptions in the specifications of this invention contain many specifics, these should not be construed as limiting the scope of the invention, but as merely providing details of some of the embodiments of this invention. There can be variations as follows:

The high inertia member, low inertia member, and surface can each be any component of a system, as long as they maintain there mass/inertia relationship. Therefore, there can be variations in shape or characteristics for each of them. The high inertia member, low inertia member, or any part thereof can compose another surface.

The movement transducers can be of the piezo, electrostrictive, or magnetostrictive type. They can be made of different materials or combinations thereof.

The flexible joint can be at either end of the piezo-electric element and it can be of any type that provides stiffness in the direction of expansion or contraction of the piezo-electric element but flexibility in other directions.

The electrical signals applied to the transducers can vary. They can be analog or digital. They can be generated in different ways to produce more variations.

The piezo-electric elements can cause movement in either direction depending on the signals received and thereby the assembly can effect or interface motion in either direction depending on these signals.

The assembly can further have sensors built in to measure the forces exerted in each direction. The information from these sensors can be fed back to alter the electrical signals.

Each transducer can consist of multiple piezo, electrostrictive, or magnetostrictive elements, and a complete assembly can consist of multiple assemblies, all working together to provide better structural strength, more movement, added force in multiple directions, or to accomplish a certain task.

Therefore it is to be understood that variations of these types are within the spirit and scope of this invention as defined by the appended claims and their legal equivalents.

What is claimed is:

1. An apparatus for effecting relative motion between a first surface and a second surface, comprising:
    a low inertia member;
    a moveable high inertia member;
    a first transducer, selected from a group consisting of piezo, electrostrictive and magnetostrictive actuators;
    a second transducer, selected from a group consisting of piezo, electrostrictive, and magnetostrictive actuators;
    a means for driving the first and second transducers;
    said first transducer is coupled at one end to a first means for limiting motion and coupled at the other end to said low inertia member so as to impart motion thereof in a direction that is approximately perpendicular to said second surface, said second transducer is coupled at one end to a second means for limiting motion and coupled at the other end to said low inertia member so as to impart motion thereof in a direction that is approximately parallel to said second surface, low inertia member or part thereof contacting said second surface while said second transducer is actuating, contact separation achieved by quick movement of said low inertia member with reference to movement of said moveable high inertia member when said first transducer resets, said second transducer resetting while said low inertia member or part thereof is not contacting said second surface.

2. The apparatus of claim 1 wherein said low inertia member is any component of a system that has low inertia.

3. The apparatus of claim 1 wherein said moveable high inertia member is any component of a system that has high inertia compared to said low inertia member and is moveable.

4. The apparatus of claim 1 wherein said first means for limiting motion at one end of said first transducer is said moveable high inertia member.

5. The apparatus of claim 1 wherein said second means for limiting motion at one end of said second transducer is said first surface.

6. The apparatus of claims 1 wherein said first means for limiting motion at one end of said first transducer and said second means for limiting motion at one end of said second transducer are the same.

7. The apparatus of claim 1 wherein said first surface is that of said moveable high inertia member.

8. The apparatus of claim 1 wherein said first surface is coupled to said moveable high inertia member.

9. The apparatus of claim 1 wherein said first surface is fixed.

10. The apparatus of claim 1 wherein said second surface is fixed.

11. The apparatus of claim 1 wherein said first surface and said second surface are moveable.

12. The apparatus of claim 1 wherein said second surface is that of any component of a system.

13. The apparatus of claim 1 wherein the means for driving said first and second transducers is a signal generator.

14. The apparatus of claim 1 wherein said first transducer and said second transducer are coupled to said low inertia member via hinges, respectively.

15. The apparatus of claim 1 wherein said first transducer and said second transducer are coupled to said first means for limiting motion and said second means for limiting motion via hinges, respectively.

16. The apparatus of claim 1 wherein the continuous operation of said first transducer and said second transducer results in relative motion between said first surface and said second surface.

17. A method for providing an active interface between a first surface and a second surface, the method comprising:
    providing a first transducer coupled at one end to a first means for limiting motion and coupled at the other end to a low inertia member so as to impart motion thereof in a direction that is approximately perpendicular to said second surface;
    providing a second transducer coupled at one end to a second means for limiting motion and coupled at the other end to said low inertia member so as to impart motion thereof in a direction that is approximately parallel to said second surface;
    providing a moveable high inertia member;
    providing a means for driving said first and second transducers;
    contacting said low inertia member or part thereof to said second surface while said second transducer is actuating;
    separating contact between said low inertia member and said second surface by quick movement of said low inertia member with reference to movement of said moveable high inertia member as a result of resetting said first transducer;
    resetting said second transducer while said low inertia member or part thereof is not contacting said second surface.

18. The method of claim 17 wherein the continuous operation of said first and said second transducers results in simulating frictionless contact between said first surface and said second surface.

19. The method of claim 17 further including the use of a plurality of said first transducer and said second transducer.

20. The method of claim 17 further including the use of force sensors built in to measure forces in multiple directions and send feedback to a signal generator.

* * * * *